US007816974B2

(12) United States Patent
Araki

(10) Patent No.: US 7,816,974 B2
(45) Date of Patent: Oct. 19, 2010

(54) SEMICONDUCTOR INTEGRATED CIRCUIT DEVICE

(75) Inventor: Yuta Araki, Osaka (JP)

(73) Assignee: Panasonic Corporation, Osaka (JP)

( * ) Notice: Subject to any disclaimer, the term of this patent is extended or adjusted under 35 U.S.C. 154(b) by 8 days.

(21) Appl. No.: 12/062,934

(22) Filed: Apr. 4, 2008

(65) Prior Publication Data

US 2009/0251202 A1 Oct. 8, 2009

(51) Int. Cl.
*H03K 3/01* (2006.01)

(52) U.S. Cl. ........................................................ 327/534

(58) Field of Classification Search ................. 327/534, 327/544

See application file for complete search history.

(56) References Cited

U.S. PATENT DOCUMENTS

| | | | | |
|---|---|---|---|---|
| 6,118,328 | A * | 9/2000 | Morikawa | 327/534 |
| 6,252,452 | B1 | 6/2001 | Hatori et al. | |
| 6,275,094 | B1 * | 8/2001 | Cranford et al. | 327/534 |
| 6,333,571 | B1 * | 12/2001 | Teraoka et al. | 307/125 |
| 2004/0251484 | A1 | 12/2004 | Miyazaki et al. | |
| 2005/0195020 | A1 * | 9/2005 | Matsushita | 327/541 |
| 2006/0087361 | A1 * | 4/2006 | Bhagavatheeswaran et al. | 327/427 |

FOREIGN PATENT DOCUMENTS

| | | |
|---|---|---|
| JP | 2000-138348 | 5/2000 |
| JP | 3549186 | 4/2004 |

* cited by examiner

*Primary Examiner*—Quan Tra
(74) *Attorney, Agent, or Firm*—McDermott Will & Emery LLP

(57) ABSTRACT

A control target circuit formed by transistors is provided with a power supply level control circuit for controlling the power supply voltage supplied to the control target circuit, a substrate level control circuit for controlling the substrate voltages of the transistors, and a special substrate level control circuit for controlling the substrate voltages during transition of the power supply voltage through a different system. During transition of the power supply voltage, the special substrate level control circuit positively controls the substrate voltages such that desired substrate voltage levels are reached earlier, whereby the time for the substrate voltages to transfer to the desired substrate voltage levels is shortened. To suppress latch-up and breakdown voltage degradation, the special substrate level control circuit controls supply of voltages and currents so as to comply with the potential difference conditions defined between the power supply voltage and the substrate voltages.

19 Claims, 18 Drawing Sheets

FIG. 5

| | | | | | | | |
|---|---|---|---|---|---|---|---|
| VDD | 1.2 | 1.15 | 1.1 | 1.05 | 1.0 | 0.95 | 0.9 |
| VP | 0.8 | 0.7 | 0.6 | 0.5 | 0.4 | 0.35 | 0.3 |
| VN | 0.4 | 0.45 | 0.5 | 0.55 | 0.6 | 0.6 | 0.6 |

FIG. 9

| | | | | | | | |
|---|---|---|---|---|---|---|---|
| VDD | 1.2 | 1.15 | 1.1 | 1.05 | 1.0 | 0.95 | 0.8 |
| VP | 2.7 | 2.65 | 2.6 | 2.55 | 2.5 | 2.45 | 2.3 |
| VN | −0.3 | −0.35 | −0.4 | −0.45 | −0.5 | −0.55 | −0.7 |

SEMICONDUCTOR INTEGRATED CIRCUIT DEVICE

CROSS-REFERENCE TO RELATED APPLICATIONS

This application corresponds to Japanese Patent Application No. 2006-275202 filed on Oct. 6, 2006, the entire contents of which are hereby incorporated by reference.

BACKGROUND OF THE INVENTION

1. Field of the Invention

The present invention relates to control of the power supply voltage and substrate voltage supplied to a transistor and to control of the relationships of a plurality of power supply voltages.

2. Description of the Prior Art

In recent years, in semiconductor integrated circuit devices, control of the power supply voltage and substrate voltage has been implemented for the purpose of smaller power consumption and faster operations. In the power supply level control and substrate level control, however, there is a probability that independently controlling respective ones of the power supply voltage and substrate voltage leads to occurrence of latch-up and occurrence of breakdown voltage degradation due to exceeded transistor breakdown voltage. A conventional solution to such problems is to carry out a substrate level control process not during but after transition of the power supply voltage (see Japanese Laid-Open Patent Publication No. 2000-138348).

In the case of controlling the substrate voltage to a desired level relative to the power supply voltage after a power supply level control process, elongation of the transfer time for the substrate voltage to transfer to a desired level adversely affects the mode transition time of the system. In addition, performing power supply level control and substrate level control processes independent of the respective voltages leads to occurrence of latch-up and occurrence of breakdown voltage degradation due to exceeded transistor breakdown voltage.

SUMMARY OF THE INVENTION

An objective of the present invention is to provide a semiconductor integrated circuit device wherein, in transition of the power supply voltage, the transfer time for the substrate voltage to transfer to a desired level is shortened. Another objective of the present invention is to suppress occurrence of latch-up and degradation of breakdown voltage in power supply level control and substrate level control.

A semiconductor integrated circuit device of the present invention includes: a power supply level control circuit for controlling a power supply voltage supplied to a circuit formed by transistors; a substrate level control circuit for controlling the substrate voltages of the transistors; and a special substrate level control circuit for controlling the substrate voltages of the transistors. The special substrate level control circuit operates during a portion or all of a period in which the substrate level control circuit urges the substrate voltages to transition. With such features, during transition of the power supply voltage, the special substrate level control circuit positively controls the substrate voltages such that desired substrate voltage levels are reached earlier, whereby the time for the substrate voltages to transfer to the desired substrate voltage levels is shortened.

To suppress latch-up and breakdown voltage degradation, the special substrate level control circuit controls supply of voltages and currents so as to comply with the potential difference conditions defined between the power supply voltage and the substrate voltages.

According to the present invention, during transition of the power supply voltage, transfer of the substrate voltages to desired levels corresponding to the power supply voltage level is hastened, and occurrence of latch-up and deterioration in reliability which are major concerns in that process can be suppressed.

BRIEF DESCRIPTION OF THE DRAWINGS

FIG. 5 shows an example of a latch-up suppression condition table stored in an information storage device of FIG. 4.

FIG. 9 shows an example of a breakdown voltage degradation suppression condition table stored in the information storage device of FIG. 4.

DESCRIPTION OF THE PREFERRED EMBODIMENTS

Figure 1:
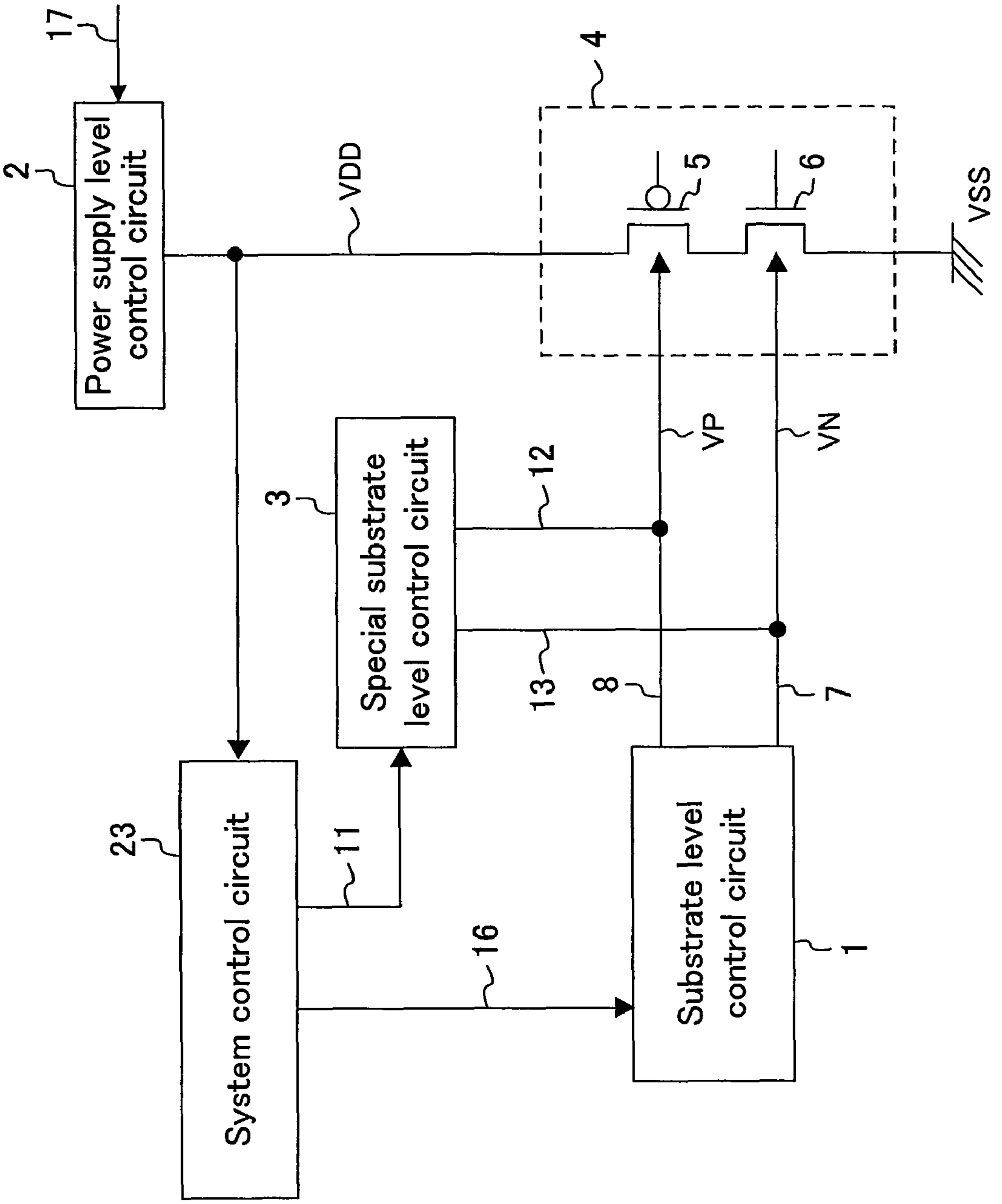
FIG. 1 is a block diagram showing the structure of a semiconductor integrated circuit device according to embodiment 1 of the present invention.

Hereinafter, embodiments of the present invention are described in detail with reference to the drawings. To avoid redundancy of description, common elements among the respective embodiments are denoted by the same reference numerals.

Embodiment 1

FIG. 1 shows the structure of a semiconductor integrated circuit device according to embodiment 1 of the present invention. As shown in FIG. 1, the semiconductor integrated circuit device of this embodiment includes a substrate level control circuit 1, a power supply level control circuit 2, a special substrate level control circuit 3, a circuit 4 to be controlled (hereinafter, "control target circuit 4"), and a system control circuit 23. The control target circuit 4 is formed by a P-channel transistor 5 and an N-channel transistor 6. The power supply level control circuit 2 receives the power supply level control signal 17 and outputs internal power supply voltage VDD. The system control circuit 23 receives VDD and outputs the special substrate level control signal 11 and the substrate level control signal 16. The substrate level control circuit 1 receives the substrate level control signal 16 and outputs the substrate level control output 8 for P-channel transistor (hereinafter, "P-substrate level control output 8") and the substrate level control output 7 for N-channel transistor (hereinafter, "N-substrate level control output 7"). The special substrate level control circuit 3 receives the special substrate level control signal 11 and outputs the special substrate level control output 12 for P-channel transistor (hereinafter, "special P-substrate level control output 12") and the special substrate level control output 13 for N-channel transistor (hereinafter, "special N-substrate level control output 13"). The control target circuit 4 receives internal power supply voltage VDD, P-channel transistor substrate voltage VP, and N-channel transistor substrate voltage VN. Voltage VP is formed by the P-substrate level control output 8 and the special P-substrate level control output 12. Voltage VN is formed by the N-substrate level control output 7 and the special N-substrate level control output 13. The special substrate level control circuit 3 operates during a portion or all of a period where the substrate level control circuit 1 urges the substrate voltages to transition.

Figure 2:
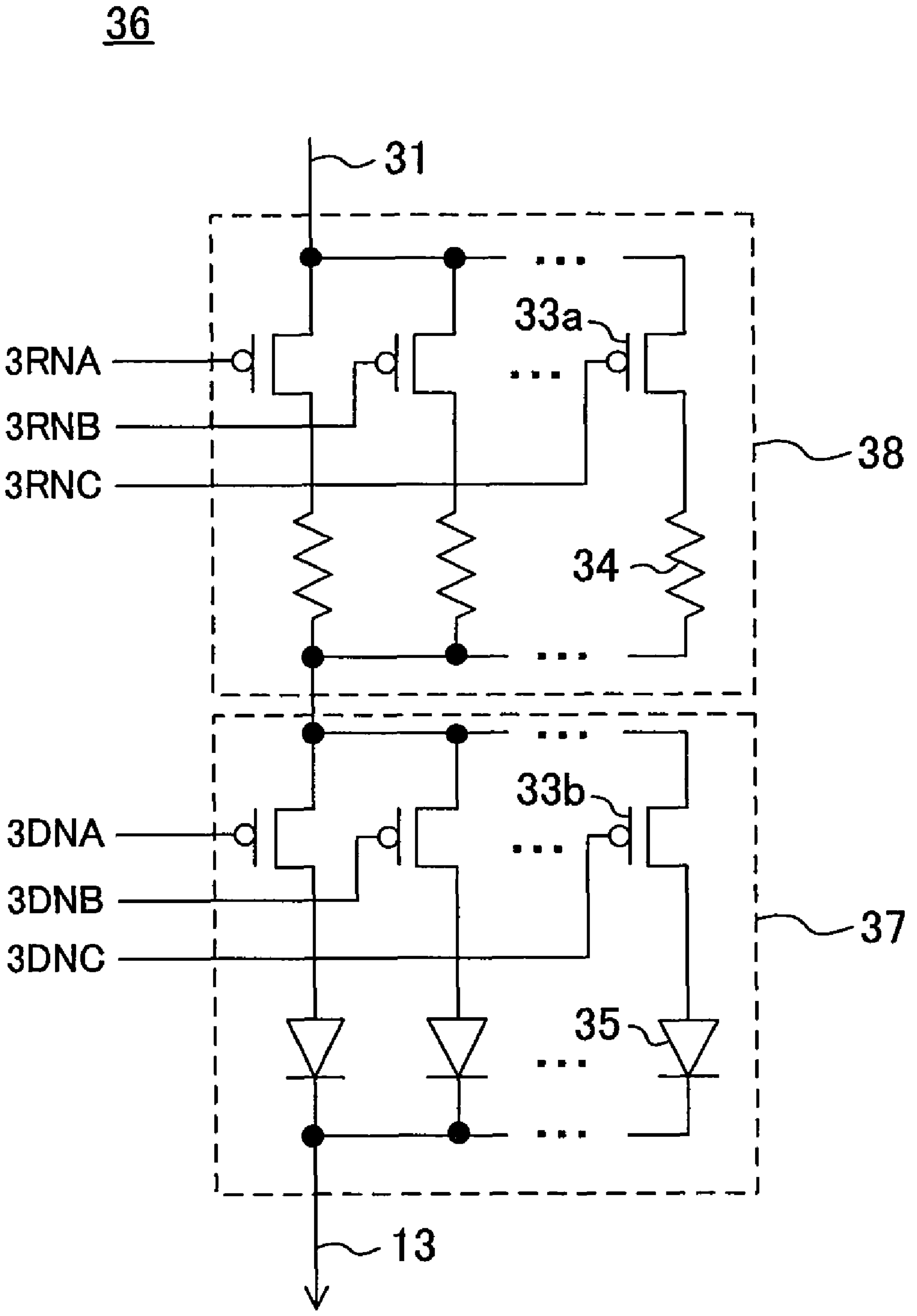
FIG. 2 shows a specific example of the structure of an N-channel transistor side of a special substrate level control circuit of FIG. 1.
Figure 3:
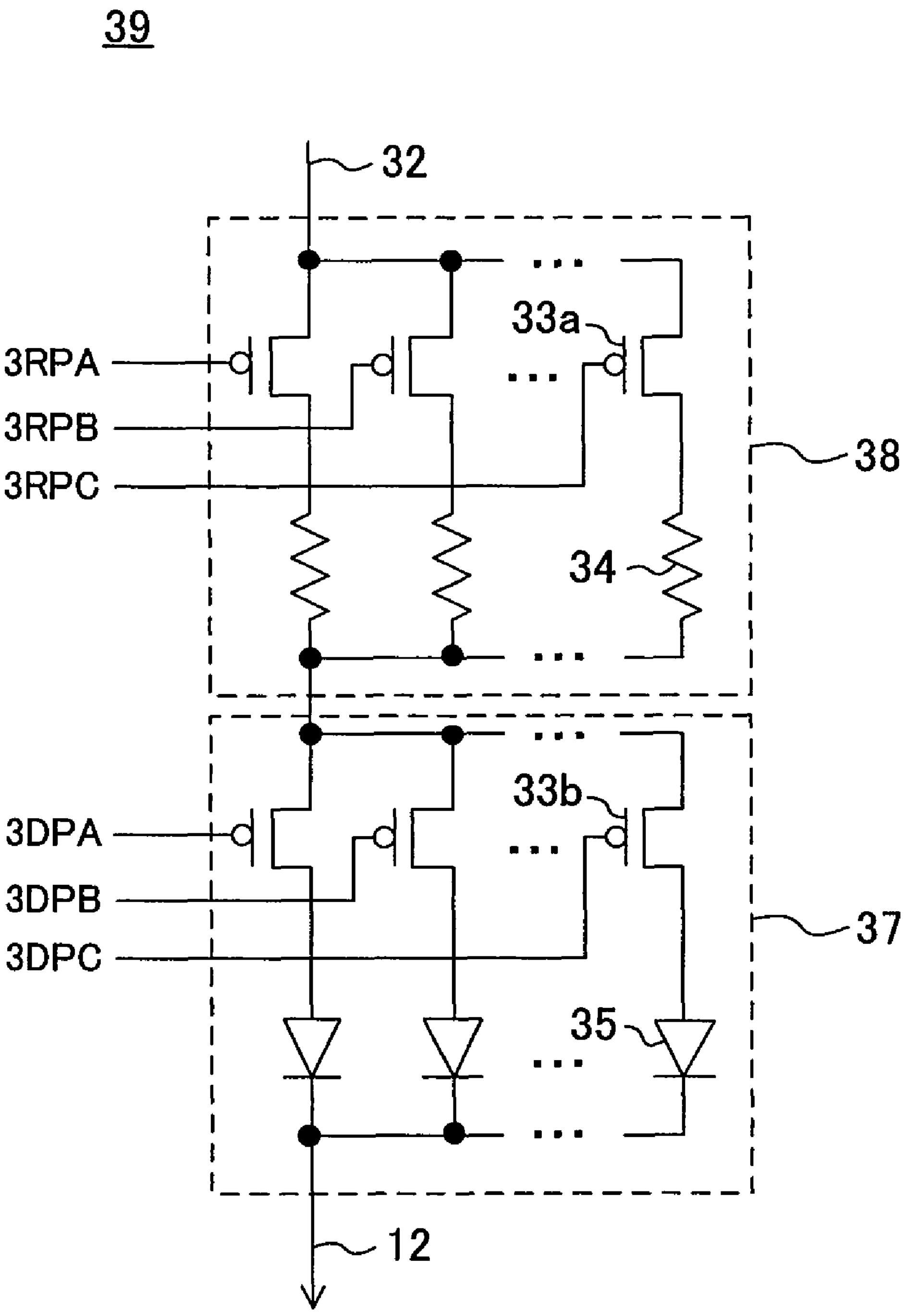
FIG. 3 shows a specific example of the structure of a P-channel transistor side of a special substrate level control circuit of FIG. 1.

FIG. 2 and FIG. 3 show specific examples of the structure of the special substrate level control circuit 3 of FIG. 1. Referring to FIG. 2 and FIG. 3, the special substrate level control circuit 3 includes an N-channel transistor side component 36 and a P-channel transistor side component 39.

As shown in FIG. 2, the N-channel transistor side component 36 is formed by a voltage value modifier 38 and a current drivability modifier 37 and receives the power supply voltage 31. In the voltage value modifier 38, the power supply voltage 31 is supplied to the sources of a plurality of P-channel transistors 33*a*. The drains of the P-channel transistors 33*a* are connected in series to resistors 34. The outputs of the P-channel transistors 33*a* via the resistors 34 are commonly coupled together. The gates of the P-channel transistors 33*a* are respectively supplied with signals 3RNA, 3RNB, . . . , and 3RNC. In the current drivability modifier 37, the signal output from the voltage value modifier 38 is supplied to the sources of a plurality of P-channel transistors 33*b*. The drains of the P-channel transistors 33*b* are respectively connected in series to the anodes of diodes 35. The cathodes of the diodes 35 are commonly coupled together to output the special N-substrate level control output 13. The gates of the P-channel transistors 33*b* are respectively supplied with signals 3DNA, 3DNB, . . . , and 3DNC. Signals 3RNA, 3RNB, . . . , and 3RNC enable selection of the plurality of resistors 34 so that the output voltage value is changeable according to supply of the power supply voltage 31. Signals 3DNA, 3DNB, . . . , and 3DNC enable selection of the plurality of diodes 35 so that the current drivability is changeable according to the voltage output from the voltage value modifier 38.

As shown in FIG. 3, the P-channel transistor side component 39 is also formed by a voltage value modifier 38 and a current drivability modifier 37 and receives the power supply voltage 32. The control signals supplied to the P-channel transistors 33*a* of the voltage value modifier 38 of the P-channel transistor side component 39, 3RPA, 3RPB, . . . , and 3RPC, are different from those supplied to the N-channel transistor side component 36. The control signals supplied to the P-channel transistors 33*b* of the current drivability modifier 37 of the P-channel transistor side component 39, 3DPA, 3DPB, . . . , and 3DPC, are different from those supplied to the N-channel transistor side component 36. The output voltage value is changeable by selection of signals 3RPA, 3RPB, . . . , and 3RPC. The current drivability is changeable by selection of signals 3DPA, 3DPB, . . . , and 3DPC.

The diodes 35 shown in FIG. 2 and FIG. 3 may have any structure so long as they have the functions of the diode. The resistors 34 shown in FIG. 2 and FIG. 3 may have any structure so long as they have the functions of the resistor.

Next, the operation of the semiconductor integrated circuit device of this embodiment is described separately for the power supply level control step, the substrate level control step, and the special substrate level control step.

In the power supply level control step, the power supply level control circuit 2 operates in response to input of the power supply level control signal 17 to supply VDD at a desired level to the transistors 5 and 6 of the control target circuit 4.

In the substrate level control step, the substrate level control circuit 1 operates in response to input of the substrate level control signal 16 to output the substrate voltages at desired levels as the P-substrate level control output 8 and N-substrate level control output 7 to the substrates of the transistors 5 and 6 of the control target circuit 4.

In the special substrate level control step, the special substrate level control circuit 3 operates in response to input of the special substrate level control signal 11 to output the substrate voltages/currents at desired levels as the special P-substrate level control output 12 and the special N-substrate level control output 13 to the substrates of the transistors 5 and 6 of the control target circuit 4.

According to the present invention, when VDD transitions from the first power supply voltage value to the second power supply voltage value in the power supply level control step, the substrate level control output from the substrate level control circuit 1 transitions from the first substrate voltage to the second substrate voltage in the substrate level control step. In addition, in the special substrate level control step, the voltage is supplied from the special substrate level control circuit 3 to the substrate. These features provide the effect of achieving quick transfer to a desired level of the substrate voltage which is necessary after the power supply level transition to shorten the time for the substrate voltage to transfer to the desired level. Further, the special substrate level control step is carried out only during transition of the power supply level but is halted during the time when the power supply voltage and substrate voltages are stably supplied, whereby the power consumption is reduced.

The structure of FIG. 1 has still another advantageous feature that, when VDD starts to transition, the system control circuit 23 senses the power supply level transition to output the special substrate level control signal 11 and the substrate level control signal 16. With this feature, dynamic substrate level control relative to the transition of VDD is possible. It should be noted that the system control circuit 23 may be omitted while the special substrate level control signal 11 and the substrate level control signal 16 are externally supplied instead.

Embodiment 2

Figure 4:
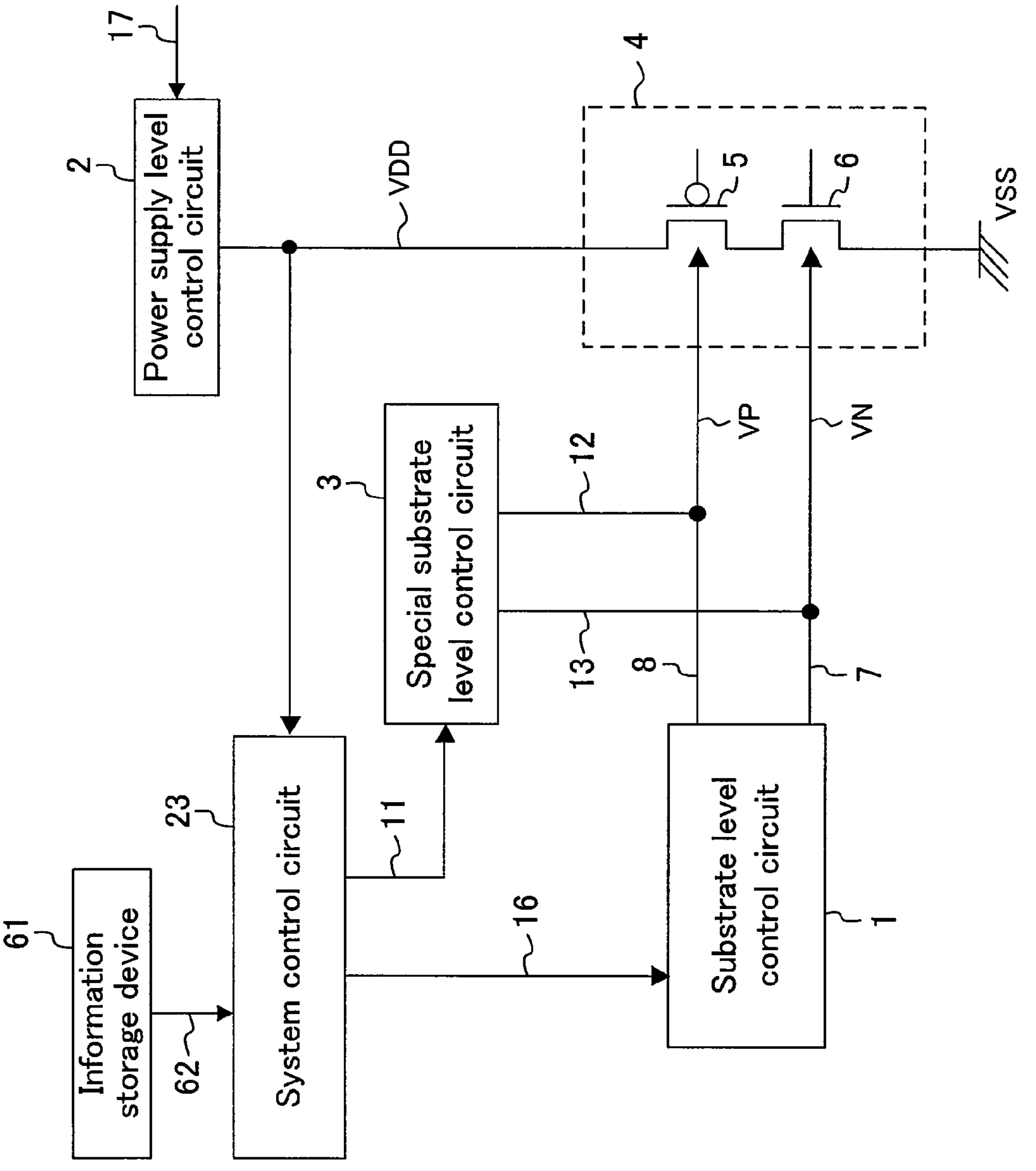
FIG. 4 is a block diagram showing the structure of a semiconductor integrated circuit device according to embodiment 2 of the present invention.

FIG. 4 shows the structure of a semiconductor integrated circuit device according to embodiment 2 of the present invention. The semiconductor integrated circuit device of FIG. 4 includes an information storage device 61 in addition to the components of the semiconductor integrated circuit device of FIG. 1. The information storage device 61 stores a data table of latch-up suppression conditions and a data table of breakdown voltage degradation suppression conditions, which will be described later. In the semiconductor integrated circuit device of embodiment 2 shown in FIG. 4, information 62 output from the information storage device 61 are input to the system control circuit 23, and the system control circuit 23 operates based on the information 62. The information storage device 61 is formed by a data-retainable circuit, for example, a volatile or nonvolatile memory.

FIG. 5 shows an example of the latch-up suppression condition table stored in the information storage device 61 of FIG. 4. Herein, suppression of latch-up which can occur under certain potential difference conditions between VDD and VP and between VDD and VN is described with reference to FIG. 5.

The table of FIG. 5 shows the relationships between VDD and VP and VN which lead to occurrence of latch-up. With VDD at 1.2 V, for example, latch-up does not occur so long as VN applied to the transistor 6 is 0.4 V or lower and VP applied to the transistor 5 is 0.8 V or higher. Namely, if VP is lower than 0.8 V or if VN exceeds 0.4 V, latch-up occurs. By setting the voltages so as to comply with the potential differences shown in the latch-up suppression condition table of FIG. 5, occurrence of latch-up can be suppressed.

It should be noted that, by suppressing occurrence of latch-up and supplying a voltage at a closest level to a desired substrate voltage after power supply level transition, occurrence of latch-up is suppressed, and the transfer time for the substrate voltage to transfer to a desired level which is necessary after power supply level transition can be shortened.

Figure 6:
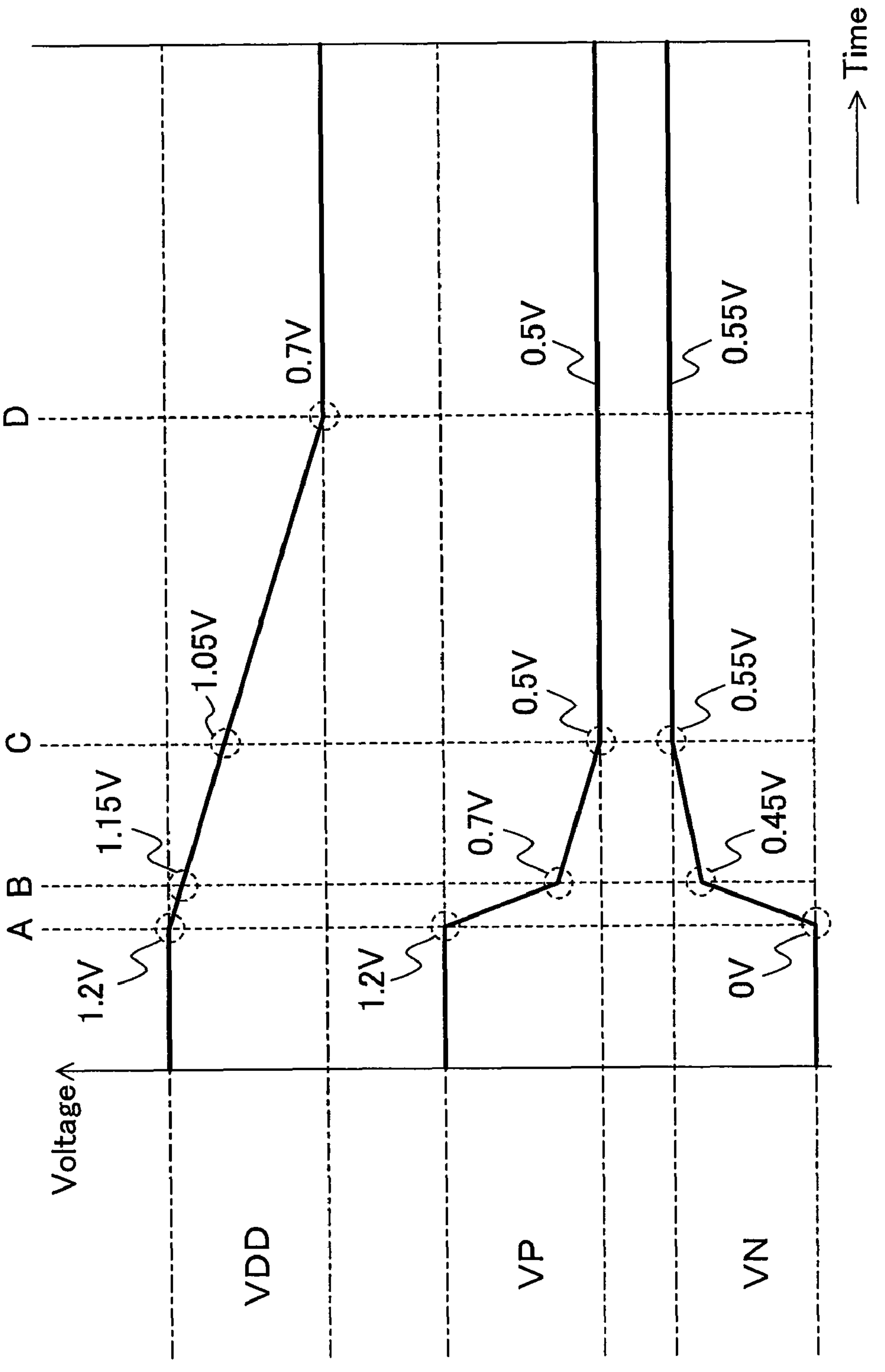
FIG. 6 is a timing chart showing an example of a sequence of suppression for occurrence of latch-up in the semiconductor integrated circuit device of FIG. 4.

FIG. 6 shows an example of the sequence of suppression for occurrence of latch-up in the semiconductor integrated circuit device of FIG. 4. This is an example of a specific method of preventing, in special substrate level control during power supply level transition, occurrence of latch-up and shortening the transfer time for the substrate voltage to transfer to a desired level which is necessary after power supply level transition. Specifically, as for the control target circuit 4, the power supply voltage is decreased while the substrates of the transistors 5 and 6 are controlled to be forward-biased (substrate of Nch transistor:Vbs=positive bias, substrate of Pch transistor:Vbs=negative bias).

In the example shown in FIG. 6, after VDD transitions from, for example, 1.2 V to 0.7 V (A→D step), the substrate voltages necessary after the power supply level transition are VP=0.5 V and VN=0.55 V. Referring to the latch-up suppression condition table of FIG. 5, in the period where VDD transitions from 1.2 V to 1.15 V (A→B step), the maximum and minimum substrate voltages which do not lead to latch-up, i.e., VP=0.7 V (for VDD=1.15 V) and VN=0.45 V (for VDD=1.15 V) are applied to the transistors. Then, in the period where VDD transitions from 1.15 V to 1.05 V (B→C step), VP=0.5 V and VN=0.55 V are applied to the transistors. Then, in the period where VDD transitions from 1.05 V to 0.7 V (C→D step), VP=0.5 V and VN=0.55 V are applied to the transistors.

The sequence of suppression for occurrence of latch-up as shown in FIG. 6 can be realized by controlling VP and VN using the special substrate level control circuit 3 or using both the special substrate level control circuit 3 and the substrate level control circuit 1 in the A→B step; using the substrate level control circuit 1 in the B→C step; and using the substrate level control circuit 1 in the C→D step. Namely, a forward bias which does not lead to latch-up with respect to the power supply voltage is supplied from at least the special substrate level control circuit 3 such that the operation of the special substrate level control circuit is halted before the substrate voltages of the transistors reach desired values.

By performing the A→B, B→C and C→D steps, occurrence of latch-up in substrate level control during power supply level transition can be suppressed, and the transfer time for the substrate voltage to transfer to a desired level which is necessary after the power supply level transition can be shortened. Further, the special substrate level control circuit 3 operates only during transition of the power supply level, so that the power consumption is small as compared with an operation where the special substrate level control circuit 3 operates all the time. Although FIG. 6 shows the example where VDD drops, the concept of this embodiment also applies to an example where VDD rises.

Figure 7:
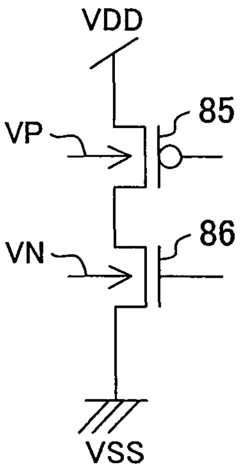
FIG. 7 shows an example of a test circuit of the semiconductor integrated circuit device of FIG. 4.

FIG. 7 shows an example of the test circuit of the semiconductor integrated circuit device of FIG. 4. The circuit of FIG. 7 is available as a circuit for latch-up test which is used in preparing the table of FIG. 5.

In the structure of FIG. 7, the drain of a P-channel transistor 85 and the drain of an N-channel transistor 86 are coupled. The source of the P-channel transistor 85 is connected to VDD. The source of the N-channel transistor 86 is connected to VSS. The substrate of the P-channel transistor 85 is connected to VP. The substrate of the N-channel transistor 86 is connected to VN.

Figure 8:
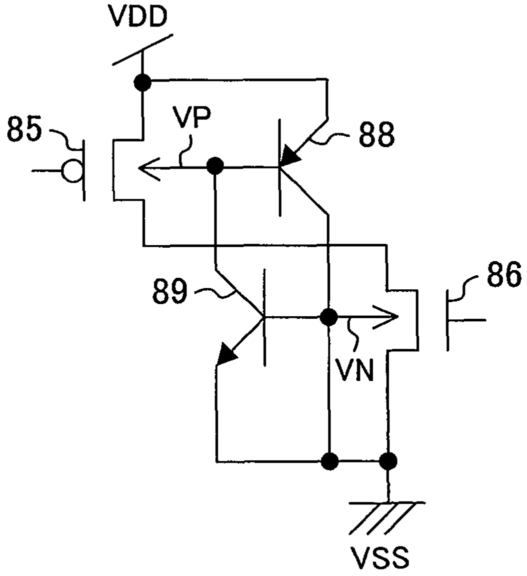
FIG. 8 is a circuit diagram showing a parasitic bipolar structure in the test circuit of FIG. 7.

FIG. 8 shows a parasitic bipolar structure around the well in the test circuit of FIG. 7. Referring to FIG. 8, a PNP bipolar transistor 88 and an NPN bipolar transistor 89 serve as parasitic elements. A current which flows from VDD via the PNP bipolar transistor 88 or the NPN bipolar transistor 89 to VSS under a certain condition of VDD and VP or VN is referred to as "latch-up current".

The structures of FIG. 7 and FIG. 8 are used to calculate the latch-up suppression conditions with the voltage conditions for VDD and the voltage conditions for VP and VN being varied within the specification condition ranges. If the latch-up current flowing from VDD to VSS via the PNP bipolar transistor 88 or the NPN bipolar transistor 89 exceeds a predetermined reference current value, this is judged as occurrence of latch-up. The voltage levels for the latch-up suppression conditions determined in this test are set in the information storage device 61 for control of the substrate voltages based on the chip characteristics. Thus, the test circuit of FIG. 7 is desirably provided together with the semiconductor integrated circuit device on the same chip.

FIG. 9 shows an example of the breakdown voltage degradation suppression condition table stored in the information storage device 61 of FIG. 4. Herein, suppression of breakdown voltage degradation which can occur under certain potential difference conditions between VDD and VP and between VDD and VN is described with reference to FIG. 9.

The table of FIG. 9 shows the relationships between VDD and VP and VN which do not lead to breakdown voltage degradation in the P-channel transistor 5 and the N-channel transistor 6 of the control target circuit 4. For example, with VDD at 1.2 V, breakdown voltage degradation is suppressed so long as VP is lower than 2.7 V and VN is lower than −0.3 V.

Figure 10:
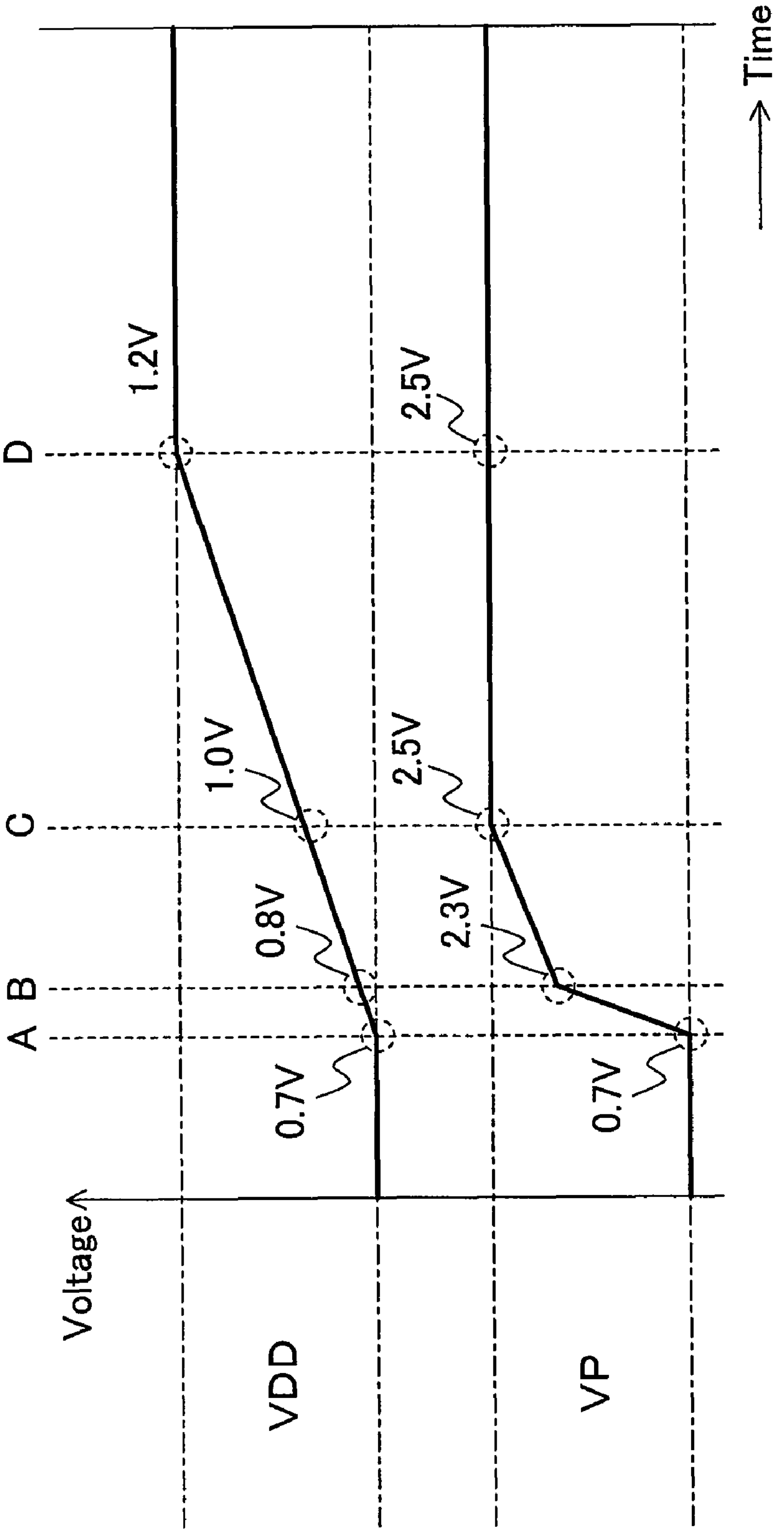
FIG. 10 is a timing chart showing an example of a sequence of suppression for breakdown voltage degradation on the P-channel transistor side of the semiconductor integrated circuit device of FIG. 4.
Figure 11:
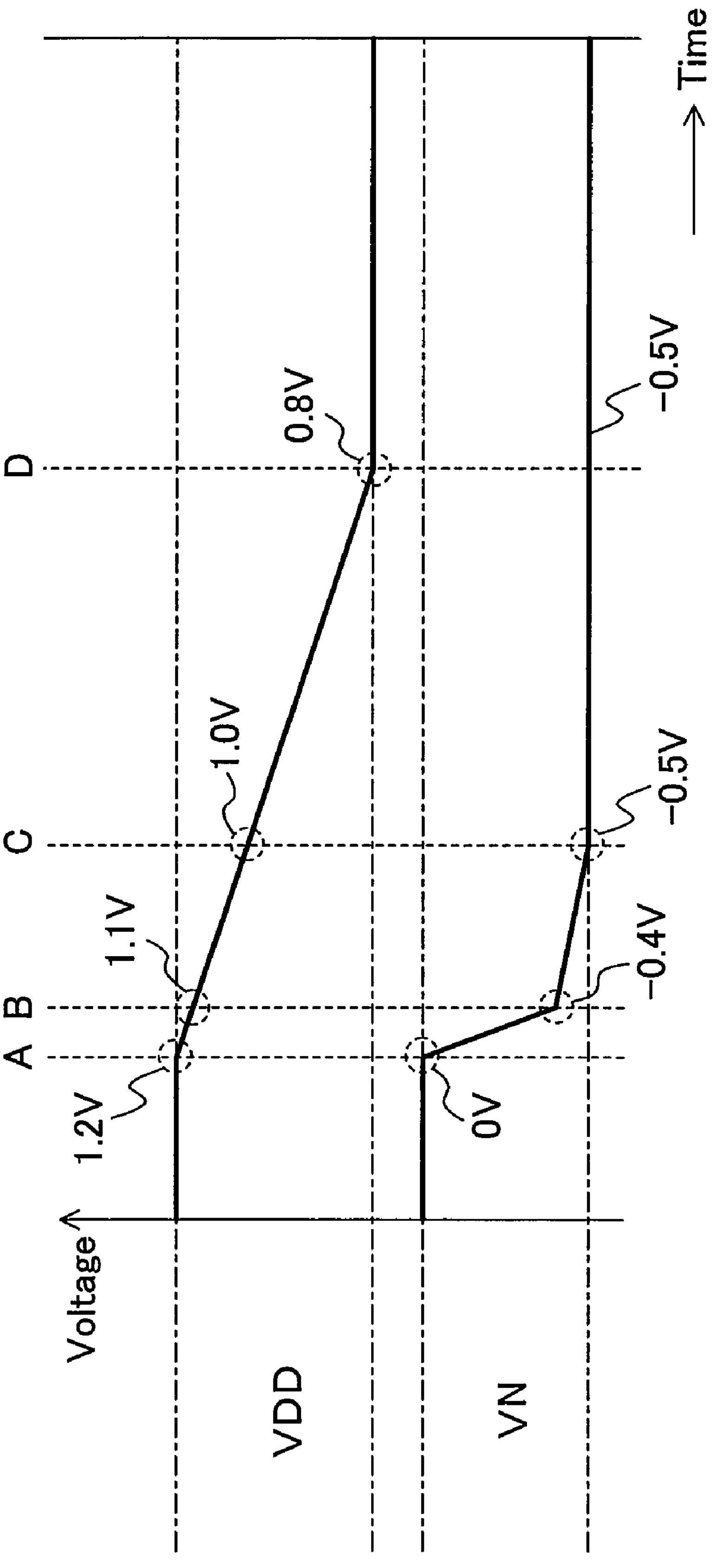
FIG. 11 is a timing chart showing an example of a sequence of suppression for breakdown voltage degradation on the N-channel transistor side of the semiconductor integrated circuit device of FIG. 4.

FIG. 10 and FIG. 11 show examples of the sequence of suppression for breakdown voltage degradation in the semiconductor integrated circuit device of FIG. 4. This is an example of a specific method of suppressing breakdown voltage degradation and shortening the transfer time for the substrate voltage to transfer to a desired level necessary after power supply level transition. Specifically, as for the control target circuit 4, the power supply voltage is increased or decreased while the substrates of the transistors 5 and 6 are controlled to be back-biased (substrate of Nch transistor: Vbs=negative bias, substrate of Pch transistor:Vbs=positive bias).

FIG. 10 shows the relationship between VDD and VP. In this example, after VDD transitions from, for example, 0.7 V to 1.2 V (A→D step), the level of VP necessary after the power supply level transition is 2.5 V. In this sequence, in the period where VDD transitions from, for example, 0.7 V to 0.8 V (A→B step), VP is controlled to be 2.3 V with VDD of 0.8 V according to the breakdown voltage degradation suppression condition table of FIG. 9. In the period where VDD transitions from 0.8 V to 1.0 V (B→C step), VP is controlled to be 2.5 V with VDD of 1.0 V. In the period where VDD transitions from 1.0 V to 1.2 V (C→D step), VP is controlled to be 2.5 V with VDD of 1.2 V.

FIG. 11 shows the relationship between VDD and VN. In this example, after VDD transitions from, for example, 1.2 V to 0.8 V (A→D step), the level of VN necessary after the power supply level transition is −0.5V. In this sequence, in the period where VDD transitions from, for example, 1.2 V to 1.1 V (A→B step), VN is controlled to be −0.4 V with VDD of 1.1 V according to the breakdown voltage degradation suppression condition table of FIG. 9. In the period where VDD transitions from 1.1 V to 1.0 V (B→C step), VN is controlled to be −0.5 V with VDD of 1.0 V. In the period where VDD transitions from 1.0 V to 0.8 V (C→D step), VN is controlled to be −0.5 V with VDD of 0.8 V.

With the table and the charts of FIG. 9, FIG. 10 and FIG. 11, the breakdown voltage degradation during transition of VDD can be suppressed, and the transfer time for the substrate voltages to transfer to VP and VN levels necessary after the power supply level transition.

In the period of A→B step, substrate voltages VP and VN are controlled using the special substrate level control circuit 3 or using both the special substrate level control circuit 3 and the substrate level control circuit 1. In the period of B→C step, substrate voltages VP and VN are controlled using the substrate level control circuit 1. In the period of C→D step, substrate voltages VP and VN are also controlled using the substrate level control circuit 1. With such a scheme, the suppression sequences for breakdown voltage degradation as shown in FIG. 10 and FIG. 11 can be realized. Namely, a back bias which does not lead to breakdown voltage degradation with respect to the power supply voltage is supplied from at least the special substrate level control circuit 3 such that the operation of the special substrate level control circuit 3 is halted before the substrate voltages of the transistors reach desired values. Further, the special substrate level control circuit 3 is locally employed to reduce the power consumption. It should be noted that the same applies to both the increase of VDD and the decrease of VDD.

The circuit of FIG. 7 is available as a breakdown voltage test circuit used in preparation of the table of FIG. 9. Namely, the structure of FIG. 7 is used to define the breakdown voltage degradation suppression conditions with the voltage conditions for VDD and the voltage conditions for VP and VN being varied within the specification condition ranges. If, as for the current value of VDD after a certain period of voltage application under constant conditions, the difference between the initial current value and the current value measured after passage of the certain period exceeds a predetermined current threshold, this is judged as occurrence of breakdown voltage degradation. The voltage levels for the breakdown voltage degradation suppression conditions determined in this test are set in the information storage device 61 for control of the substrate voltages based on the chip characteristics. Thus, the test circuit of FIG. 7 is desirably provided together with the semiconductor integrated circuit device of FIG. 4 on the same chip.

Embodiment 3

Figure 12:
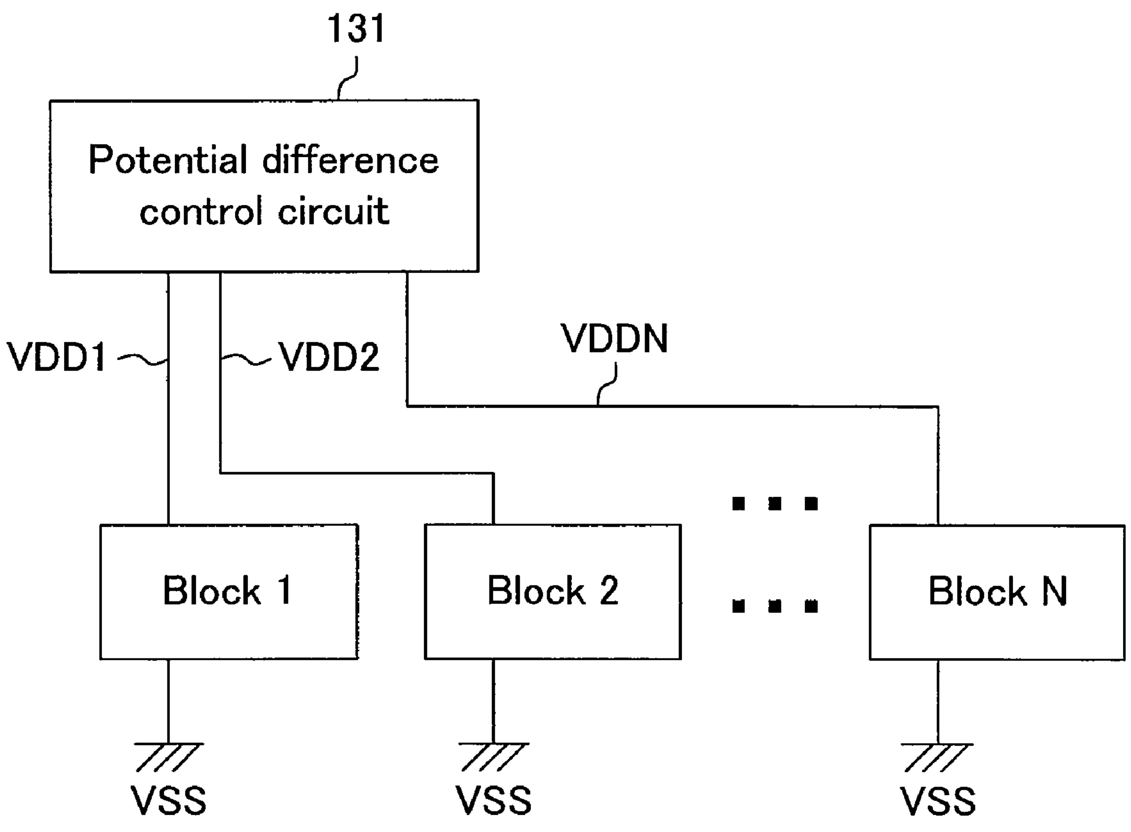
FIG. 12 is a block diagram showing the structure of a semiconductor integrated circuit device according to embodiment 3 of the present invention.

FIG. 12 shows the structure of a semiconductor integrated circuit device according to embodiment 3 of the present invention. In the semiconductor integrated circuit device of FIG. 12, the control of the relationships of first power supply voltage VDD1, second power supply voltage VDD2, . . . , and Nth power supply voltage VDDN, where N is an integer equal to or greater than 2, is realized by a potential difference control circuit 131 such that the potential differences among the N power supply blocks are maintained constant.

Figure 13:
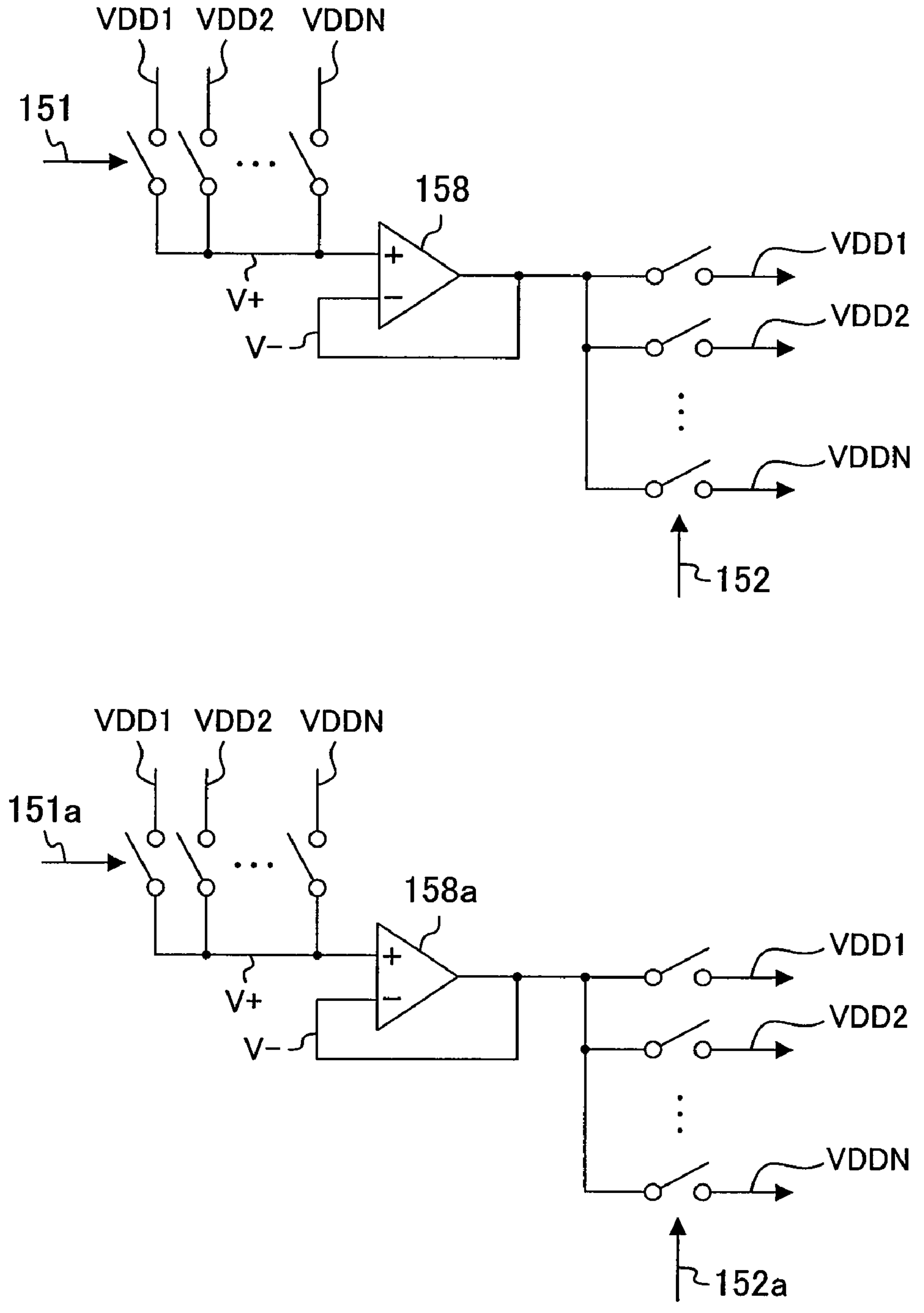
FIG. 13 shows a detailed structure example of a potential difference control circuit of FIG. 12.

FIG. 13 shows a detailed structure example of the potential difference control circuit 131 of FIG. 12. Referring to FIG. 13, non-inverted input V+ of the operational amplifier 158 is connected to VDD1, VDD2, . . . , and VDDN via respective switches. The respective switches are arbitrarily on/off-controllable based on the input switch control signal 151. The inverted input V− of the operational amplifier 158 is short-circuited to the output of the operational amplifier 158. The output of the operational amplifier 158 is connected to VDD1, VDD2, . . . , and VDDN via switches. The respective switches are arbitrarily on/off-controllable based on the output switch control signal 152.

In the structure of FIG. 13, for example, VDD2 can be maintained lower than VDD1 by 1.0 V by setting the operational amplifier 158 such that V+ is higher than V− by 1.0 V, selecting the level of VDD1 based on the input switch control signal 151, and selecting the level of VDD2 based on the output switch control signal 152. Namely, selection of the input switch signal and the output switch signal enables shifting of the target power supply voltage. Alternatively, if a plurality of power supply voltages need to have constant potential differences, for example, if VDDN need to be maintained lower than VDD1 by 0.5 V, the operational amplifier 158*a* is set such that V+ is higher than V− by 0.5 V, and VDD2 is selected based on the input switch control signal 151*a* and VDDN is selected based on the output switch control signal 152*a*, whereby VDD2 can be maintained higher than VDDN by 0.5 V. In this way, the above-described circuit structure is provided to respective one of the pairs of power supply voltages which are to have constant potential differences, whereby a plurality of power supplies can have constant potential differences.

Figure 14:
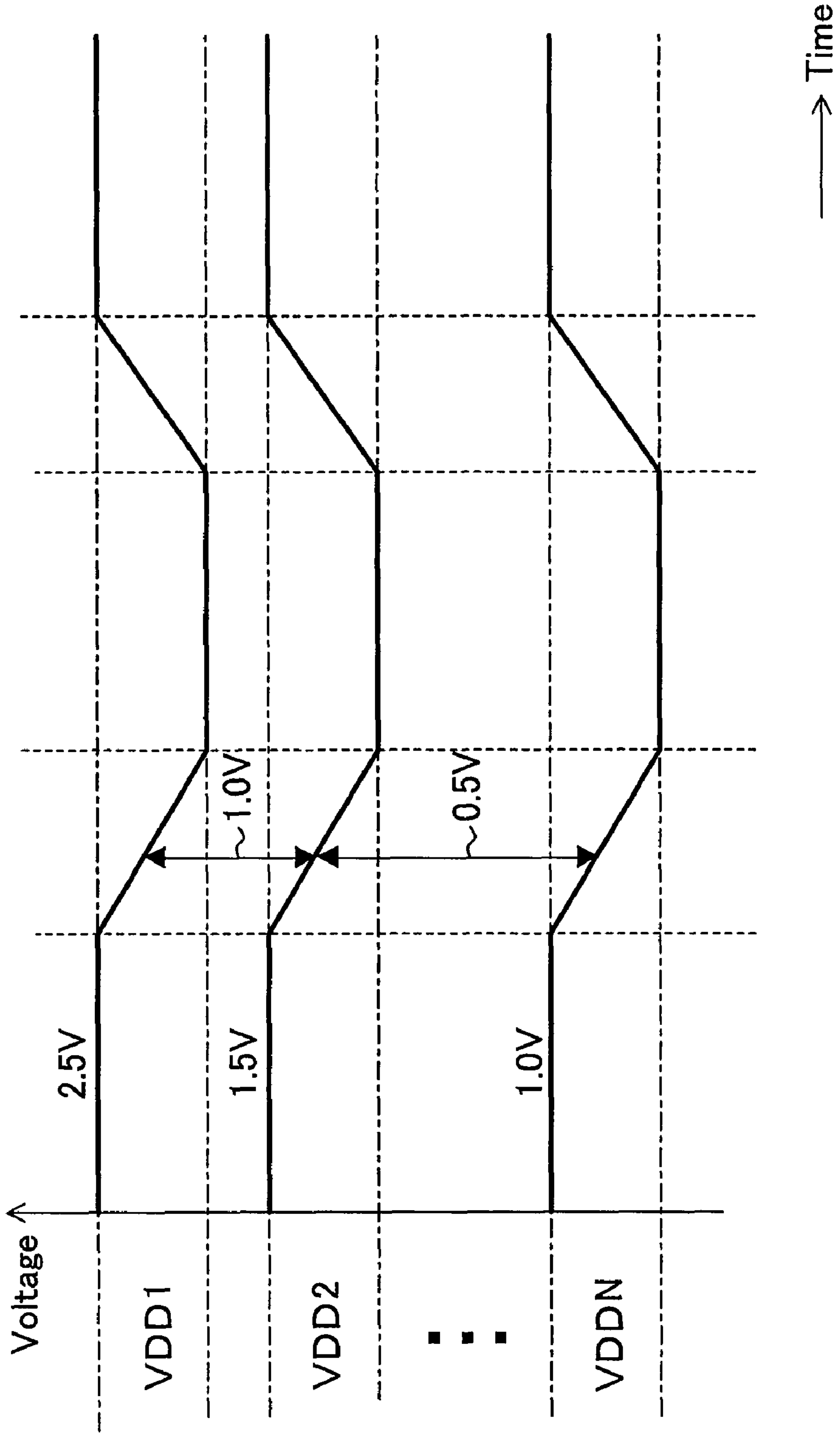
FIG. 14 shows a potential difference control sequence example for a plurality of power supply voltages in the semiconductor integrated circuit device of FIG. 12.

FIG. 14 shows a potential difference control sequence example for a plurality of power supply voltages in the semiconductor integrated circuit device of FIG. 12. Referring to FIG. 14, for example, transition of VDD1 from 2.5 V occurs while the voltages are controlled such that the potential difference between VDD2 and VDD1 is maintained to be 1.0 V. Transition of VDD2 from 1.5 V occurs while the voltages are controlled such that the potential difference between VDD2 and VDDN is maintained to be 0.5 V.

Figure 15:
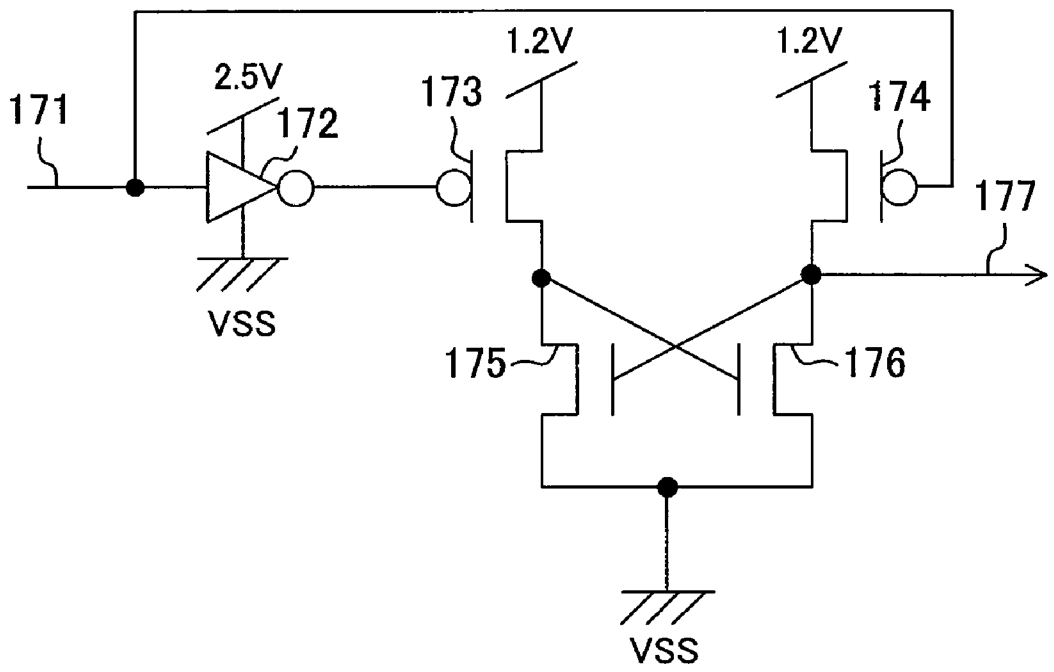
FIG. 15 is a circuit diagram showing an example of a circuit block receiving a plurality of power supply voltages in the semiconductor integrated circuit device of FIG. 12.

FIG. 15 shows a level shifter circuit, which is an example of a circuit block receiving a plurality of power supply voltages in the semiconductor integrated circuit device of FIG. 12. In the level shifter circuit of FIG. 15, the input 171 is input to the gate of a 2.5 V type inverter 172 and is also connected to the gate of a succeeding P-channel transistor 174. The output of the 2.5 V type inverter 172 is input to the gate of a preceding P-channel transistor 173. The source of the P-channel transistor 173 is connected to 1.2 V power supply. The drain of the P-channel transistor 173 is connected to the drain of an N-channel transistor 175 and, hence, connected to VSS via the N-channel transistor 175. The source of a succeeding P-channel transistor 174 is connected to 1.2 V power supply. The drain of the P-channel transistor 174 is connected to the output 177 and to the drain of an N-channel transistor 176. The source of the N-channel transistor 176 is connected to VSS. The drain of the preceding P-channel transistor 173 is connected to the gate of the succeeding N-channel transistor 176. The succeeding output 177 is connected to the gate of the preceding N-channel transistor 175. The four transistors 173 to 176 at the preceding and succeeding stages are each formed by a 1.2 V type transistor.

In the above-described circuit structure, if as in the conventional techniques the gate of the P-channel transistor 173 is supplied with 2.5 V and the source of the P-channel transistor 173 is supplied with 1.2 V and transition of the voltage of 1.2 V type power supply to 0.7 V occurs with a constant voltage of 2.5 V type power supply, the voltage between the gate and source of the P-channel transistor 173 would increase from 1.3 V to 1.8 V, resulting in the probability of occurrence of breakdown voltage degradation.

However, according to the present invention, even when the voltage of the 1.2 V type power supply transitions to 0.7 V, the voltage of the 2.5 V type power supply is controlled to be 1.7 V so long as the operational amplifier 158 of FIG. 13 is set such that the input potential difference is maintained to be 1.0 V. Thus, the voltage between the gate and source of the P-channel transistor 173 is decreased to 1.0 V, and as a result, breakdown voltage degradation can be reduced. It should be noted that, in the example of FIG. 13, the operational amplifier 158 may be replaced by a regulator.

Embodiments 1 to 3 of the present invention are as described above. Next, examples of a system including a semiconductor integrated circuit device of the present invention are described.

Figure 16:
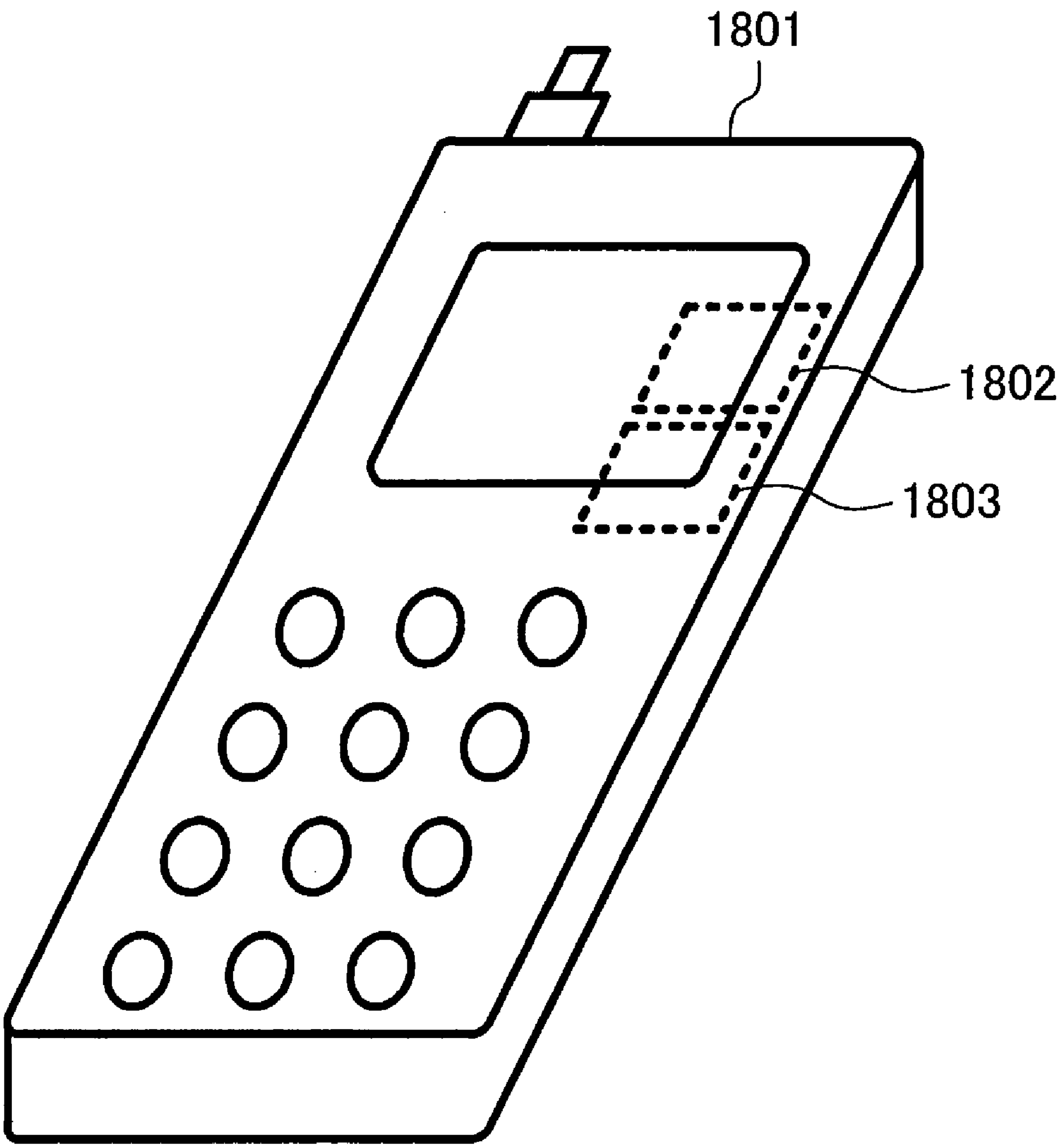
FIG. 16 is a perspective view of a communication device which includes a semiconductor integrated circuit of the present invention.

FIG. 16 is a general view of a communication device, which is an electronic device example including a semiconductor integrated circuit device of the present invention. The mobile phone handset 1801 includes a baseband LSI 1802 and an application LSI 1803. The baseband LSI 1802 and the application LSI 1803 are LSIs each including a semiconductor integrated circuit device of the present invention. The semiconductor integrated circuit device of the present invention is capable of quickly supplying a desired substrate voltage as compared with the conventional techniques, namely, capable of quick transition in the respective modes, and thus can operate with smaller power consumption. Therefore, the baseband LSI 1802 and the application LSI 1803 and the mobile phone handset 1801 including the LSIs 1802 and 1803 can also operate with smaller power consumption. As for an LSI included in the mobile phone handset 1801 other than the baseband LSI 1802 and the application LSI 1803, if a logic circuit included in the LSI is formed by a semiconductor integrated circuit device of the present invention, the above-described effects are also achieved in this logic circuit.

The communication device including a semiconductor integrated circuit device of the present invention is not limited to mobile phones but is applicable to different kinds of communication devices, such as transmitters and receivers in communication systems, modem devices for data communication, etc. Namely, the present invention provides the effect of reducing power consumption in every kinds of communication devices irrespective of whether they are wired or wireless, optical communication or electric communication, digital or analog.

Figure 17:
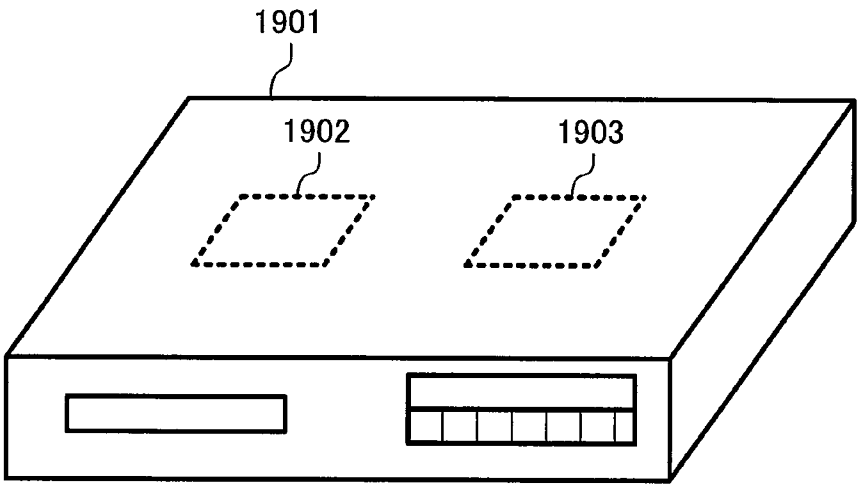
FIG. 17 is a perspective view of a data player which includes a semiconductor integrated circuit of the present invention.

FIG. 17 is a general view of a data player, which is an electronic device example including a semiconductor integrated circuit device of the present invention. The optical disc device 1901 includes a media signal processing LSI 1902 for processing signals retrieved from an optical disc and an error correction/servo processing LSI 1903 for error correction to the retrieved signals and servo control for an optical pickup. The media signal processing LSI 1902 and the error correction/servo processing LSI 1903 are LSIs each including a semiconductor integrated circuit device of the present invention. The semiconductor integrated circuit device of the present invention can operate with small power consumption as compared with the conventional techniques, and therefore, the media signal processing LSI 1902 and the error correction/servo processing LSI 1903 and the optical disc device 1901 including the LSIs 1902 and 1903 can also operate with smaller power consumption. As for an LSI included in the optical disc device 1901 other than the media signal processing LSI 1902 and the error correction/servo processing LSI 1903, if a logic circuit included in the LSI is formed by a semiconductor integrated circuit device of the present invention, the above-described effects are also achieved in this logic circuit.

The data player including a semiconductor integrated circuit device of the present invention is not limited to optical disc devices but is applicable to different kinds of data players, such as an image recorder-player including a magnetic disk or semiconductor memory housed therein as a medium. Namely, the present invention provides the effect of reducing power consumption in every kinds of data players (which may have data recording functions) irrespective of the type of medium in which data is contained.

Figure 18:
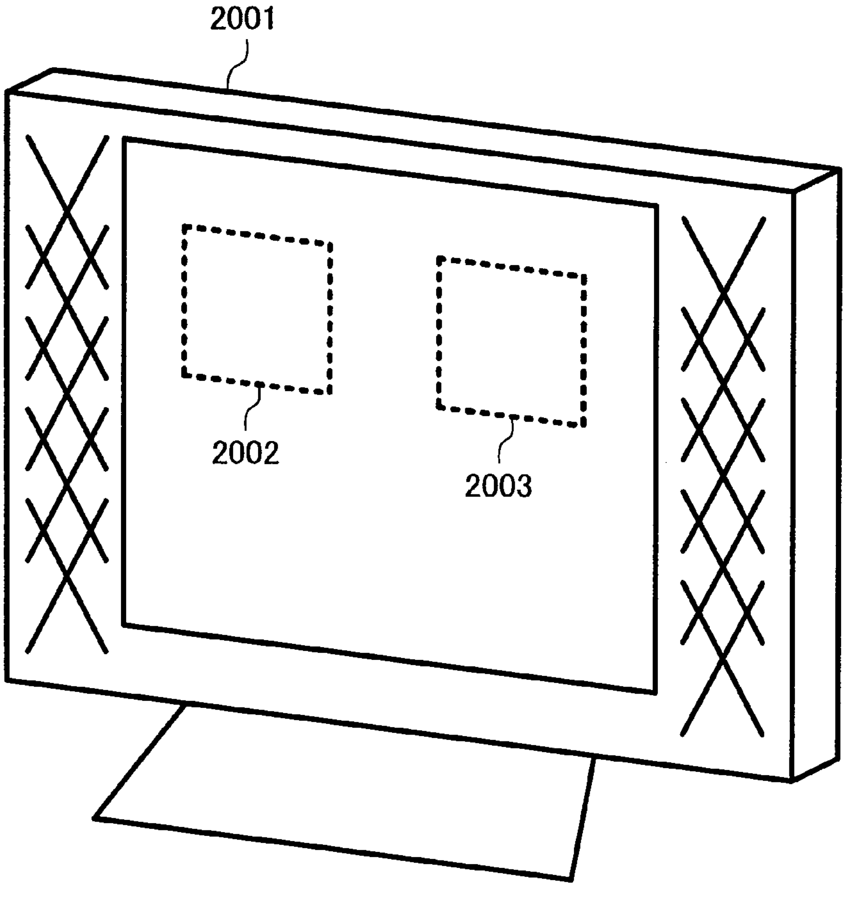
FIG. 18 is a perspective view of an image display device which includes a semiconductor integrated circuit of the present invention.

FIG. 18 is a general view of an image display device, which is an electronic device example including a semiconductor integrated circuit device of the present invention. The television receiver 2001 includes an image/sound processing LSI 2002 for processing image signals and sound signals and a display/sound control LSI 2003 for controlling display screens, loudspeakers, and other relevant devices. The image/sound processing LSI 2002 and the display/sound control LSI 2003 are LSIs each including a semiconductor integrated circuit device of the present invention. The semiconductor integrated circuit device of the present invention can operate with small power consumption as compared with the conventional techniques, and therefore, the image/sound processing LSI 2002 and the display/sound control LSI 2003 and the television receiver 2001 including the LSIs 2002 and 2003 can also operate with smaller power consumption. As for an LSI included in the television receiver 2001 other than the image/sound processing LSI 2002 and the display/sound control LSI 2003, if a logic circuit included in the LSI is formed by a semiconductor integrated circuit device of the present invention, the above-described effects are also achieved in this logic circuit.

The image display device including a semiconductor integrated circuit device of the present invention is not limited to television receivers but is applicable to different kinds of image display devices, such as a device for displaying streaming data distributed through an electric communication network. Namely, the present invention provides the effect of reducing power consumption in every kinds of image display devices irrespective of the type of data communication system.

Figure 19:
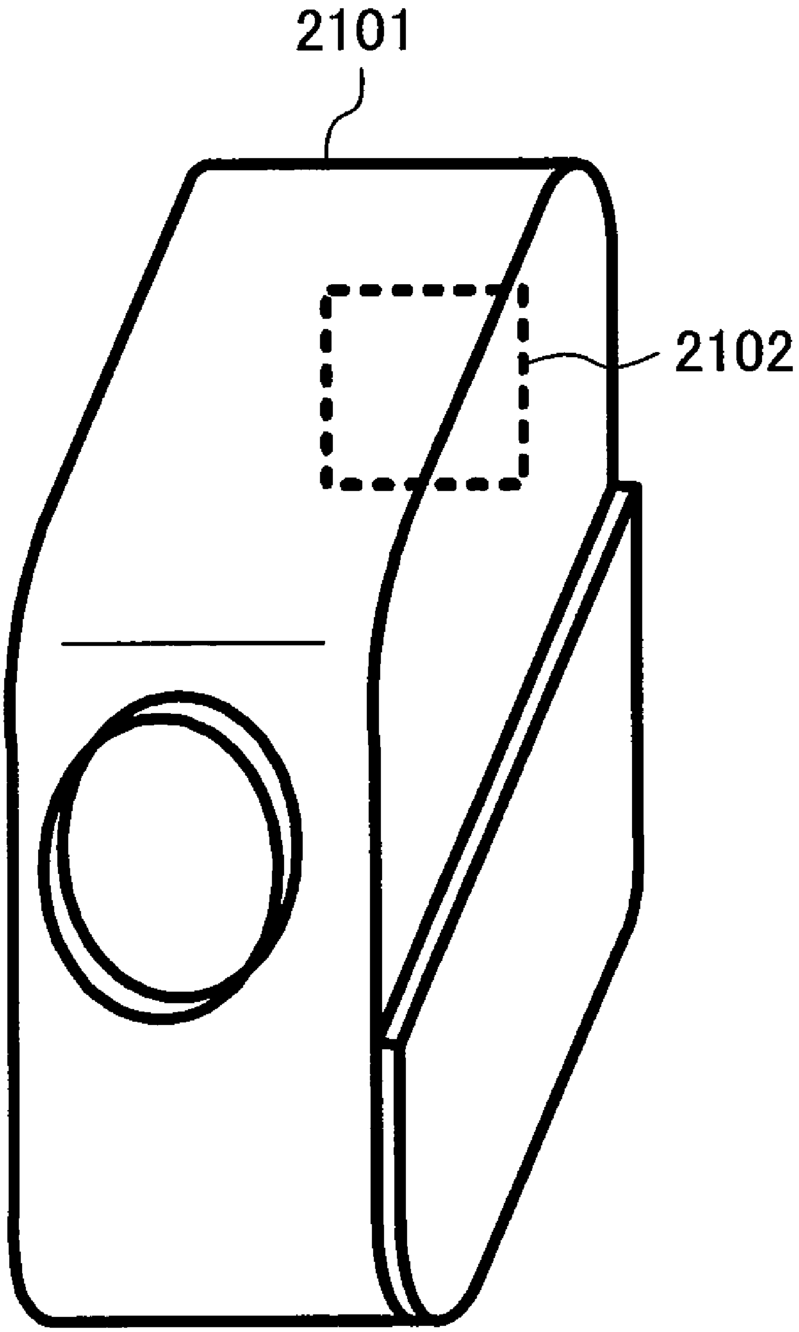
FIG. 19 is a perspective view of an electronic device which includes a semiconductor integrated circuit of the present invention.

FIG. 19 is a general view of an electronic device including a semiconductor integrated circuit device of the present invention. The digital camera 2101 includes a signal processing LSI 2102 which has a semiconductor integrated circuit device of the present invention. The semiconductor integrated circuit device of the present invention can operate with small power consumption as compared with the conventional techniques, and therefore, the signal processing LSI 2102 and the digital camera 2101 including the LSI 2102 can also operate with smaller power consumption. As for an LSI included in the digital camera 2101 other than the signal processing LSI 2102, if a logic circuit included in the LSI is formed by a semiconductor integrated circuit device of the present invention, the above-described effects are also achieved in this logic circuit.

The electronic device including a semiconductor integrated circuit device of the present invention is not limited to digital cameras but is applicable to different kinds of electronic devices, such as sensor devices, electronic calculators, etc., namely, applicable to almost every kinds of electronic devices having LSIs. The present invention provides the effect of reducing power consumption in every kinds of electronic devices.

Figure 20:
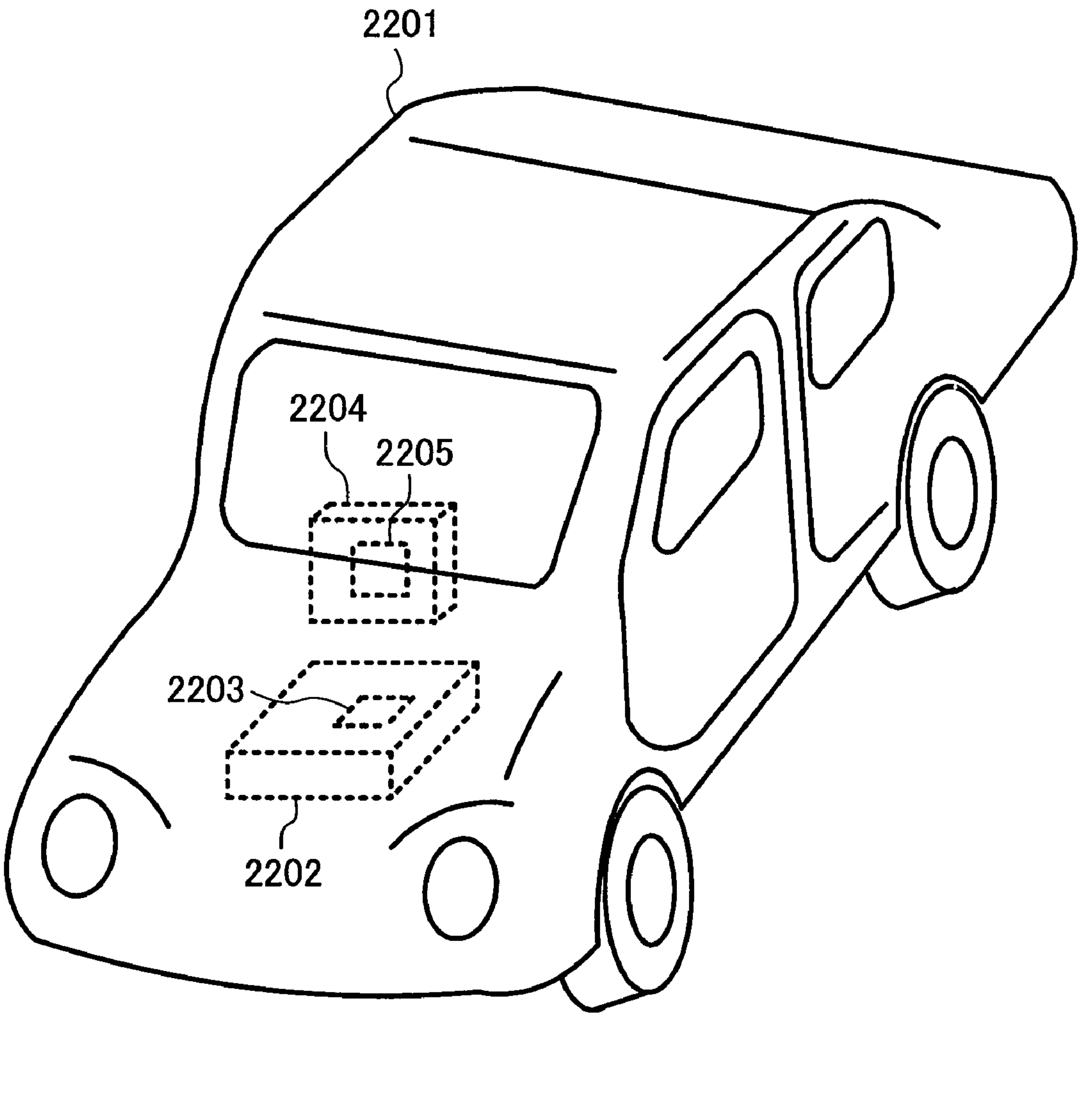
FIG. 20 is a perspective view of an electronic controller which includes a semiconductor integrated circuit of the present invention and a mobile apparatus carrying the electronic controller.

FIG. 20 is a general view of an electronic controller, which is an electronic device example including a semiconductor integrated circuit device of the present invention, and a mobile apparatus carrying the electronic controller. The automobile 2201 includes an electronic controller 2202. The electronic controller 2202 includes an engine/transmission control LSI 2203 for controlling the engine, transmission, and other relevant components of the automobile 2201, which is an LSI having a semiconductor integrated circuit device of the present invention. The automobile 2201 includes a navigation system 2204. The navigation system 2204 includes a navigation system LSI 2205 which is also a semiconductor integrated circuit device of the present invention, as does the electronic controller 2202.

The semiconductor integrated circuit device of the present invention can operate with small power consumption as compared with the conventional techniques, and therefore, the engine/transmission control LSI 2203 and the electronic controller 2202 including the LSI 2203 can also operate with smaller power consumption. Also, the navigation system LSI 2205 and the navigation system 2204 including the LSI 2205 can operate with smaller power consumption. As for an LSI included in the electronic controller 2202 other than the engine/transmission control LSI 2203, if a logic circuit included in the LSI is formed by a semiconductor integrated circuit device of the present invention, the above-described effects are also achieved in this logic circuit. The same also applies to the navigation system 2204. The smaller power consumption in the electronic controller 2202 leads to reduction of power consumption in the automobile 2201.

The electronic controller including a semiconductor integrated circuit device of the present invention is not limited to the above-described engine/transmission controller but is applicable to different kinds of controllers, such as motor controllers, namely, applicable to almost every kinds of controllers which have LSIs for controlling motive power sources. The present invention provides the effect of reducing power consumption in every kinds of electronic controllers.

The mobile apparatus including a semiconductor integrated circuit device of the present invention is not limited to automobiles but is applicable to different kinds of mobile apparatuses, such as train cars, airplanes, etc., namely, applicable to almost every kinds of mobile apparatuses which have electronic controllers for controlling motive power sources, such as engines, motors, etc. The present invention provides the effect of reducing power consumption in every kinds of mobile apparatuses.

A semiconductor integrated circuit device of the present invention includes, as basic elements, a power supply level controller, a substrate level controller, and a special substrate level controller, and is useful for, for example, control of the power supply voltage and substrate voltage.

Also, a semiconductor integrated circuit device of the present invention is applicable to communication devices, data players, image display devices, electronic devices, electronic controllers, mobile apparatuses.

What is claimed is:

1. A semiconductor integrated circuit device, comprising:

a power supply level control circuit for controlling a power supply voltage supplied to a source of a transistor of a control target circuit;

a substrate level control circuit for controlling a substrate voltage supplied to a substrate of the transistor; and a special substrate level control circuit for controlling the substrate voltage supplied to the substrate, wherein the special substrate level control circuit includes:

a plurality of diode function circuits; and a diode selection switch for selecting any of the plurality of diode function circuits, wherein, when the substrate voltage transitions from a first voltage value to a second voltage value, in addition of voltage supply to the substrate by the substrate level control circuit, the special substrate level control circuit is operable to supply voltage to the substrate.

2. The semiconductor integrated circuit device of claim 1, wherein the power supply level control circuit, the substrate level control circuit and the special substrate level control circuit cooperate to shorten a transfer time for the substrate voltage to transfer to a desired level which is necessary after power supply level transition.

3. A semiconductor integrated circuit device, comprising:

a power supply level control circuit for controlling a power supply voltage supplied to a source of a transistor of a control target circuit;

a substrate level control circuit for controlling a substrate voltage supplied to a substrate of the transistor; and a special substrate level control circuit for controlling the substrate voltage supplied to the substrate, wherein the special substrate level control circuit further includes:

a plurality of diode function circuits;

a diode selection switch for selecting any of the plurality of diode function circuits;

a plurality of voltage determination resistors for determining a voltage to be supplied; and a resistance selection switch for selecting any of the plurality of voltage determination resistors.

4. The semiconductor integrated circuit device of claim 1, further comprising a system control circuit for controlling the operation of the substrate level control circuit and the special substrate level control circuit according to an internal power supply voltage which is output from the power supply level control circuit.

5. The semiconductor integrated circuit device of claim 1, wherein a manner of supplying the substrate voltage is changed according to a latch-up suppression condition defined between the power supply voltage and the substrate voltage to suppress occurrence of latch-up in the transistor in the midst of power supply level transition.

6. The semiconductor integrated circuit device of claim 5, further comprising a table in which the latch-up suppression condition is preliminarily defined.

7. A semiconductor integrated circuit device, comprising:

a power supply level control circuit for controlling a power supply voltage supplied to a source of a transistor of a control target circuit;

a substrate level control circuit for controlling a substrate voltage supplied to a substrate of the transistor; and a special substrate level control circuit for controlling the substrate voltage supplied to the substrate, wherein the special substrate level control circuit includes:

a plurality of diode function circuits; and a diode selection switch for selecting any of the plurality of diode function circuits, wherein a manner of supplying the substrate voltage is changed according to a latch-up suppression condition defined between the power supply voltage and the substrate voltage to suppress occurrence of latch-up in the transistor in the midst of power supply level transition, the semiconductor integrated circuit device further comprising:

a table in which the latch-up suppression condition is preliminarily defined; and an information storage device for storing the table.

8. The semiconductor integrated circuit device of claim 5, further comprising a circuit component for latch-up test.

9. The semiconductor integrated circuit device of claim 2 wherein, when controlling the substrate voltage of the transistor while decreasing the power supply voltage, at least the special substrate level control circuit supplies a bias which does not cause latch-up with respect to the power supply voltage and operation of the special substrate level control circuit is halted before the substrate voltage of the transistor reaches a desired value.

10. The semiconductor integrated circuit device of claim 1, wherein a manner of supplying the substrate voltage is changed according to a breakdown voltage degradation suppression condition defined between the power supply voltage and the substrate voltage to suppress degradation in a breakdown voltage of the transistor in the midst of power supply level transition.

11. The semiconductor integrated circuit device of claim 10, further comprising a table in which the breakdown voltage degradation suppression condition is preliminarily defined.

12. A semiconductor integrated circuit device, comprising:

a power supply level control circuit for controlling a power supply voltage supplied to a source of a transistor of a control target circuit;

a substrate level control circuit for controlling a substrate voltage supplied to a substrate of the transistor; and a special substrate level control circuit for controlling the substrate voltage supplied to the substrate, wherein the special substrate level control circuit includes:

a plurality of diode function circuits; and a diode selection switch for selecting any of the plurality of diode function circuits, wherein a manner of supplying the substrate voltage is changed according to a breakdown voltage degradation suppression condition defined between the power supply voltage and the substrate voltage to suppress degradation in a breakdown voltage of the transistor in the midst of power supply level transition, the semiconductor integrated circuit device further comprising:

a table in which the breakdown voltage degradation suppression condition is preliminarily defined; and an information storage device for storing the table.

13. The semiconductor integrated circuit device of claim 10, further comprising a circuit component for breakdown voltage test.

14. The semiconductor integrated circuit device of claim 2 wherein, when controlling the substrate voltage of the transistor while increasing or decreasing the power supply voltage, at least the special substrate level control circuit supplies a bias which does not cause a breakdown voltage degradation with respect to the power supply voltage and operation of the special substrate level control circuit is halted before the substrate voltage of the transistor reaches a desired value.

15. An electronic device comprising the semiconductor integrated circuit device of claim 1.

16. The semiconductor integrated circuit device of claim 1, wherein the special substrate level control circuit operates during a portion or all of a period in which the substrate level control circuit makes the substrate voltage in transition.

17. An electronic device comprising the semiconductor integrated circuit device of claim 3.

18. An electronic device comprising the semiconductor integrated circuit device of claim 7.

19. An electronic device comprising the semiconductor integrated circuit device of claim 12.

* * * * *